US006927156B2

(12) United States Patent
Mathew

(10) Patent No.: US 6,927,156 B2
(45) Date of Patent: Aug. 9, 2005

(54) APPARATUS AND METHOD EXTENDING FLIP-CHIP PAD STRUCTURES FOR WIREBONDING ON LOW-K DIELECTRIC SILICON

(75) Inventor: Ranjan J. Mathew, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/465,171

(22) Filed: Jun. 18, 2003

(65) Prior Publication Data

US 2004/0256704 A1 Dec. 23, 2004

(51) Int. Cl.$^7$ .............................................. H01L 21/44
(52) U.S. Cl. ...................... 438/612; 438/614; 438/617; 438/622
(58) Field of Search ................................ 438/612, 617, 438/622, 614

(56) References Cited

U.S. PATENT DOCUMENTS

| | | | | |
|---|---|---|---|---|
| 4,714,517 A | | 12/1987 | Malladi et al. ............. | 156/629 |
| 4,800,178 A | | 1/1989 | Mathew et al. ............. | 437/206 |
| 5,023,697 A | * | 6/1991 | Tsumura ..................... | 257/780 |
| 5,346,858 A | * | 9/1994 | Thomas et al. ............. | 438/669 |
| 5,525,546 A | * | 6/1996 | Harada et al. .............. | 438/612 |
| 6,313,541 B1 | * | 11/2001 | Chan et al. ................. | 257/786 |
| 6,515,372 B1 | * | 2/2003 | Narizuka et al. ........... | 257/779 |
| 6,720,212 B2 | * | 4/2004 | Robl et al. .................. | 438/132 |

FOREIGN PATENT DOCUMENTS

JP 63-283044 * 11/1988 .................. 257/781

OTHER PUBLICATIONS

Ellis, Timothy W., et al., "Copper Wire Bonding", *Advanced Bonding: Copper Review*, Presented at SEMICON Singapore 2000—the Millennium Conference, (May 10, 2000), 10–15.

Hmiel, Andrew F., et al., "A Novel Process for Protecting Wire Bonds from Sweep During Molding", *IEEE International Electronics Manufacturing Technology Symposium, Jul. 17–18, 2002*, (2002), 9 pages.

* cited by examiner

*Primary Examiner*—Jasmine Clark
(74) *Attorney, Agent, or Firm*—Schwegman, Lundberg, Woessner & Kluth, P.A.

(57) ABSTRACT

A method and apparatus for making pad structures suitable for wirebonding and, optionally, also for solder-ball connections. Some embodiments include an electronics chip having a substrate with circuitry, a compliant electrically insulating layer deposited on at least a portion of the substrate, and an electrical connection pad, the pad having an electrical connection to the circuitry through an aperture in the insulating layer and a peripheral bonding zone region extending over the insulating layer. In some embodiments, the bonding zone is exclusively over the insulating layer outside of the aperture. In some embodiments, the pads are suitable for both solder-ball and wirebond connections. By making a wirebond connection to an area of a pad over the compliant insulating layer, the underlying circuitry is protected from ultrasonic energy of the bonding process.

15 Claims, 5 Drawing Sheets

APPARATUS AND METHOD EXTENDING FLIP-CHIP PAD STRUCTURES FOR WIREBONDING ON LOW-K DIELECTRIC SILICON

FIELD OF THE INVENTION

This invention relates to the field of electronic package fabrication, and more specifically to a method and apparatus for making pad structures for wirebonding and/or solder-ball connections.

BACKGROUND OF THE INVENTION

Bare electronic chips typically need to be packaged in a package that provides an electric circuit between each electrical connection of the chip and an external connector such as a pin or a ball extending from the package to external circuitry such as a printed circuit board. In designing rules for manufacturing chips having different geometries (such as smaller features of devices such as wiling traces or transistors) it is costly to design, test, and qualify additional features. Chips that run at extremely high frequencies, e.g., upwards of 40 gigahertz, also have rule constraints as to the type, thickness, spacing, and layout of traces and signal pads required to provide adequate signal capability. Further, such chips typically need to be run at very low voltages (e.g., about one volt) and very high currents (e.g., one hundred amps), which must be provided in order to achieve the desired high frequencies.

The circuit side of the chip typically provides pads that are connected to the chip's packaging using, for example, solder-ball connections.

Typical high-performance packaging can include a ball-grid array package having relatively large balls (e.g., in a ball-grid array) with relatively large spacings on one side of the package for external connections, and small closely spaced pads on the same side or the opposite side for connections to a ball-grid-array set of solder-ball connections to the electronic chip (such as a processor, communications, or memory chip).

Wirebonding equipment and manufacturing processes are often less expensive than tight-tolerance solder ball equipment and manufacturing processes, particularly for devices that can accommodate the signal characteristics provided by wirebond connections.

A package typically has a non-conductive substrate (such as a plastic film or layer) with conductive traces (wires) on or in a surface of the substrate. Either solder ball connections or wirebond connects a chip to the package. Some packages include multiple chips, such as one or more logic or processor chips, one or more communications chips (such as for a cell phone or wireless LAN), and/or one or more memory chips, such as a FLASH-type reprogrammable non-volatile memory. Optionally, a cover or encapsulant is used to enclose the chip or chips.

What is needed is a simple, inexpensive, reliable method and apparatus to fabricate packaging for electronic chips, so that solder ball connections or wirebond connections can be used.

DESCRIPTION OF PREFERRED EMBODIMENTS

Figure 1:
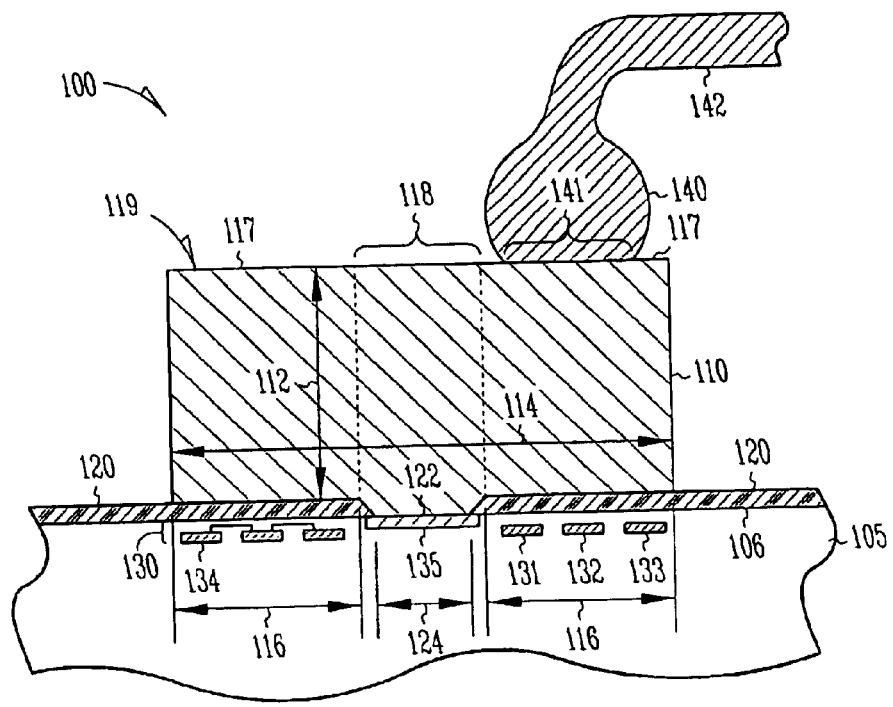
FIG. 1 is a cross-section schematic view of a portion of an electronics chip 100.

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. The same reference number or label may refer to signals and connections, and the actual meaning will be clear from its use in the context of the description.

Terminology

The terms chip, die, integrated circuit, monolithic device, semiconductor device, and microelectronic device, are used interchangeably in this description.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally copper (Cu) or an alloy of Cu and another metal such as nickel (Ni), aluminum (Al), titanium (Ti), molybdenum (Mo), or stacked layers of different metals, alloys or other combinations, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

In this description, the term metal applies both to substantially pure single metallic elements and to alloys or combinations of two or more elements, at least one of which is a metallic element.

The term substrate or core generally refers to the physical that is the basic workpiece that is transformed by various process operations into the desired microelectronic configuration. Substrates may include conducting material (such as copper or aluminum), insulating material (such as sapphire, ceramic, or plastic), semiconducting materials (such as silicon), non-semiconducting, or combinations of semiconducting and non-semiconducting materials. In some embodiments, substrates include layered structures, such as a core sheet or piece of material (such as iron-nickel alloy) chosen for its a coefficient of thermal expansion (CTE) that more closely matches the CTE of an adjacent structure such as a silicon processor chip. In some embodiments, such a substrate core is laminated to a sheet of material chosen for electrical and/or thermal conductivity (such as a copper or aluminum alloy), which in turn is covered with a layer of plastic chosen for electrical insulation, stability, and embossing characteristics. In some embodiments, the plastic layer has wiring traces that carry signals and electrical power horizontally, and vias that carry signals and electrical power vertically between layers of traces.

The term vertical is defined to mean substantially perpendicular to the major surface of a substrate. Height or depth refers to a distance in a direction perpendicular to the major surface of a substrate.

FIG. 1 is a cross-section schematic view of a portion of an electronics chip 100. Chip 100 includes electronics circuitry 130 that typically includes a plurality of semiconductor devices 134 and a plurality of electric traces 135, 131, 132, and/or 133. Covering this circuitry is an electrically insulating passivation layer 120. In some embodiments, some or all of layer 120 is compliant. In some embodiments, layer 120 is compliant at least under the wirebonding zone. In some embodiments, the degree of compliance is adjusted in areas directly underneath the critical wirebond areas by choosing different, more or less compliant materials, or, in other embodiments, optically photoprocessing those zones with different degrees of cure states. In some embodiments, insulating layer 120 includes a nitride layer deposited on the major top surface 106 of substrate 105, the nitride layer covered with a plastic layer, for example, including a polyimide, that provides compliance or elasticity. In some embodiments, the circular aperture 122 through insulating layer 120 has an opening diameter 124.

In some such embodiments, opening diameter 124 (through which pad 110 (also called pillar 110) connects to wiring trace 135) is twenty (20) microns. In some embodiments, pad 110 is made of copper and cylindrical in shape, is centered on aperture 122, and has a diameter 114 of about one-hundred six (106) microns, and a height 112 of about fifty-two (52) microns. In some embodiments, other choices of materials besides copper are used for the pad, and in some embodiments, pad 110 includes wirebondable metals such as gold, nickel, gold-tin alloys, tin-bearing solder alloys, and/or lead-bearing solder alloys, etc., either as the entire pad material, or as a coating or surface layer. In some embodiments, pad 110 is cleaned to remove, and/or suppress formation of, any native oxides that may have formed on its top surface 119, for example by using carboxylic acid and/or kept clean just before wirebonding by flooding the surface (or enclosing device 100 in a chamber) with a reducing atmosphere, or a gas such as $N_2$ that does not form oxides or otherwise contaminate surface 119. An example of an oxide inhibitor that also leaves the copper surface in a wirebondable condition is citric acid (as taught in U.S. Pat. Nos. 4,714,517 and, 4,800,178) In other embodiments, the process includes suppressing the growth of oxides using, e.g., copper anti-oxidant treatments (e.g., benzimidazole derivatives) and/or OSP (organic surface protection solder preservative), etc.

In some embodiments, the material used for ball 140 and wire 142 of the wirebond structure is gold or a gold alloy. As the bond pad pitch (pad-pad spacing) is reduced to, for example, sixty (60) microns, the diameter of bonding wire must be reduced to, for example twenty-five (25) microns to allow for the smaller bond pad passivation opening (e.g., 52 um). The use of gold presents problems of reduced breaking load, and reduced stiffness at smaller diameters. Thus, in other embodiments, copper, a copper alloy, or other metal is used. In some embodiments, copper wire has twice the strength and 40% higher stiffness than gold wire. In some embodiments, the invention uses bonding equipment and processes such as available from Kulicke and Soffa (www.kns.com). In other embodiments, the material used for ball 140 and wire 142 of the wirebond structure used for wirebonding include Pd or Au—Pd alloy.

In some embodiments, pad 110 is designed to rules that comply with the requirements of fabricating a solder-ball connection on top surface 117. Designing a pad, such as pad 300 of FIG. 3, that is specifically optimized for wirebonding would typically be quite expensive. Further, the ultrasonic energy used to bond a wirebond ball 140 having a "flying" wire 142 to connect to packaging presents problems for the underlying substrate 105 and circuitry 130 which are typically somewhat fragile. Yet further, even if wirebond pad 300 is deposited directly on substrate surface 106 without a buffering layer 120, when it is made large enough to be a suitable wirebond target, it covers a substantial amount of substrate real estate that otherwise could be used for circuitry.

Thus, in some embodiments, the compliant insulating layer 120 provides a buffer between the wirebond ultrasonics and the underlying fragile substructures, e.g., circuitry 130 in silicon substrate 105 in some embodiments. Thus, in some embodiments, a wirebond target bonding zone 117 (the area to which wirebonding is allowed) is annular in shape, and surrounds the excluded zone 118 (which represents the circular area in which wirebonding is not allowed). In some embodiments, excluded zone 118 is above and slightly larger than opening 122. In some embodiments, wirebonding to excluded zone 118 is avoided since doing so conducts unwanted energy (from the ultrasonic bonding operation) directly through pad 110 and trace 135 to substrate 105 and any circuitry 130 therein. In some embodiments, a compliant insulating layer 120 underlying annular bonding zone 117 helps dampen vibrations and prevent the ultrasonic bonding operation energy from damaging circuitry 130. Furthermore, the use of specialized capillaries and the selection of appropriate wirebonding settings, including wirebonding capillary impact forces and capillary deceleration settings, can be combined with these compliant insulating structures to result in better-optimized conditions to prevent the low-K silicon materials from fracturing or delaminating between sublayers.

Although only one pad is shown in FIG. 1, it is understood that a typical chip 100 includes a plurality of such pads. In some embodiments, the pads are made to a common specification that is suitable for either solder-ball connections or wirebond connections. In some embodiments, the pad size and pitch specification needed for solder-ball connections are each larger dimensions than would be needed if the pads only needed to meet requirements for wirebonding.

Figure 2:
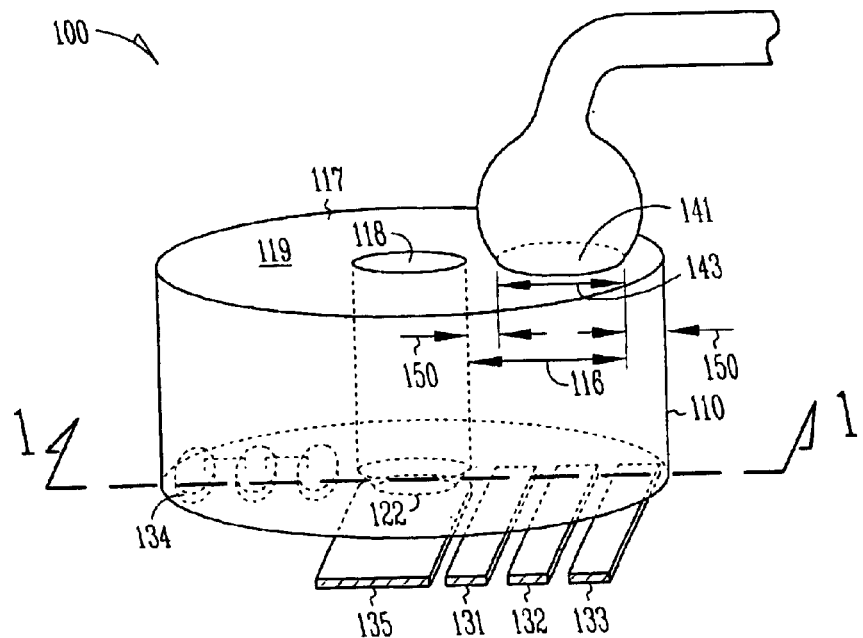
FIG. 2 is a partial cross-section perspective schematic view of electronics chip 100.

FIG. 2 is a partial cross-section perspective schematic view of electronics chip 100. Dimension 116 represents the width of annular wirebond target bonding zone 117, and the circle of contact area 141 represents the contact area between ball 140 and the annular wirebond target bonding zone 117 of the top surface of pad 110. Wiring traces 131, 132, 133, and 135 can be seen extending from under pad 110. When contact area 141 is centered between the inner and outer diameters of annular target, a space of width 150 will exist on both sides between contact area 141 and the edges of target zone 117. Thus, width 150 represents the allowable tolerance of misalignment for the wirebonding apparatus. In other words, width 116 of bonding zone 117 is two times the misalignment tolerance 150, plus the diameter of contact area 141.

Figure 3:
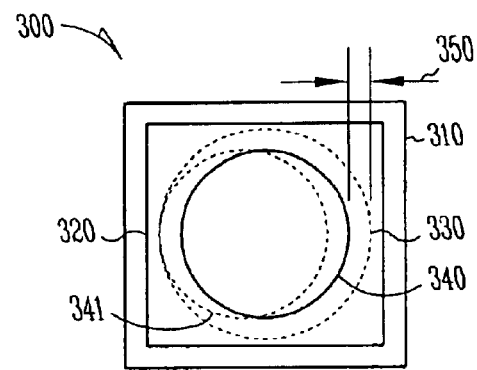
FIG. 3 is a top view schematic of a wirebond pad 300.

FIG. 3 is a top view schematic of a conventional wirebond pad 300. The top surface of pad 300 is bounded by square 310, and the outer edges of pad 300 are covered by insulating passivation that extends in to square 320, which represents the edge of the central opening in which the wirebond is made. Circle 340 represents the area of a wirebond contact that is centered within opening 320. Circle 330 represents the outer boundary of the bonding zone where wirebond contact should be made, and misalignment tolerance distance 350 is the difference between the radius of bonding zone circle 330 and the radius of contact area circle 340. Circle 341 represents the contact area of a misaligned wirebond contact whose center is displaced by the allowable misalignment tolerance distance 350, so the edge of contact area circle 341 touches the bonding zone circle 330.

Figure 4:
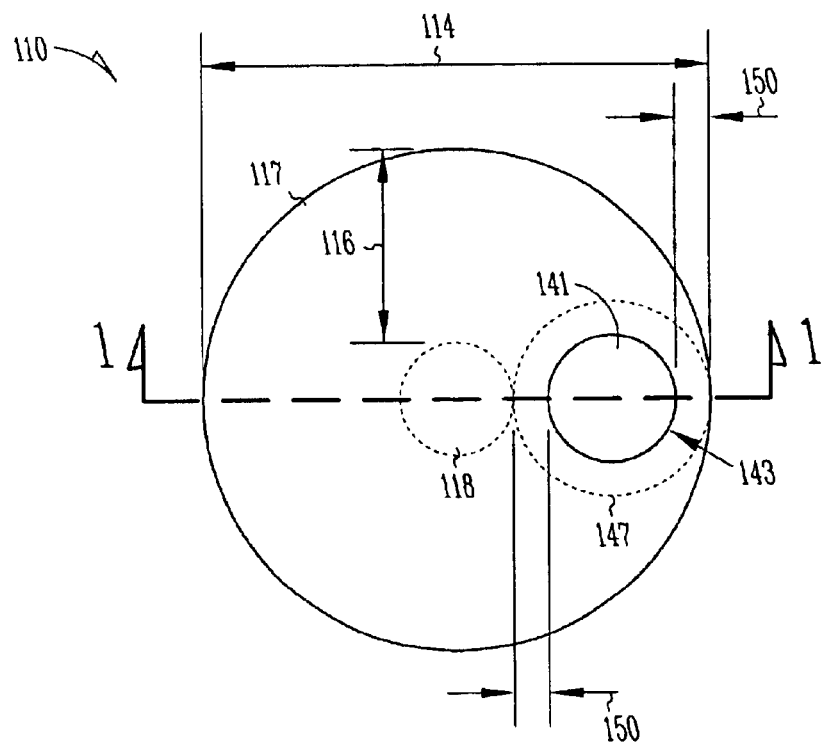
FIG. 4 is a top view schematic of a wirebond pad 110.

FIG. 4 is a top view schematic of a wirebond pad 110, which is shown in cross section in FIG. 1. Again, dimension 116 represents the width of annular wirebond target bonding zone 117, and the circle of contact area 141 represents the contact area between ball 140 and the bonding zone 117 of the top surface of pad 110. When contact area 141 is centered between the inner and outer diameters of annular target, a space of width 150 will exist on both sides between contact area 141 and the edges of target zone 117. Thus, the center of contact area 141 can be misaligned left-to-right by as much as width 150 and the contact will still be within bonding zone 117. However, contact area 141 can be anywhere on the top of pad 110 outside of excluded zone 118.

This allows a chip 100 to be made with circular pads of diameter 114 which can then be used either for solder-ball connections (with a solder ball of diameter 143 or larger), or for wirebonding connections (with a wirebond contact area 141 having diameter 143). A single set of design rules for the layout of I/O (input/output) pads can be used, and the resulting chips can be packaged using either solder balls or wirebond technology. Furthermore, the silicon level intellectual property (IP) that is used by designers for one type of chip connection (flip chip) can be re-used for connection using either type of chip connection (wirebond or flip chip). This allows economies in the reuse of silicon design layout tools, design flows and design time to adapt to market requirements where one type of chip connection may be preferred over another for a particular application. An example of a potential benefit of this assembly approach allows a designer who develops one circuit with a flip chip I/O pad, ESD structures and all the buffer circuitry for a flip chip assembly and package configuration using circular pad openings and a copper pad to also offer the same circuit in a wirebonded package or a variety of stacked-die package combinations without having to redesign the silicon layout and without having to order new silicon fabrication masks. However, a great portion of annular bonding zone 117 will be unused, since a tolerance 150 is needed to keep the contact outside the centered inner diameter (excluded zone circle 118) of bonding zone 117 and inside the outer diameter. Thus, with a bonding machine tolerance 150, the effective allowable bonding zone is indicated by reference number 147.

Figure 10:
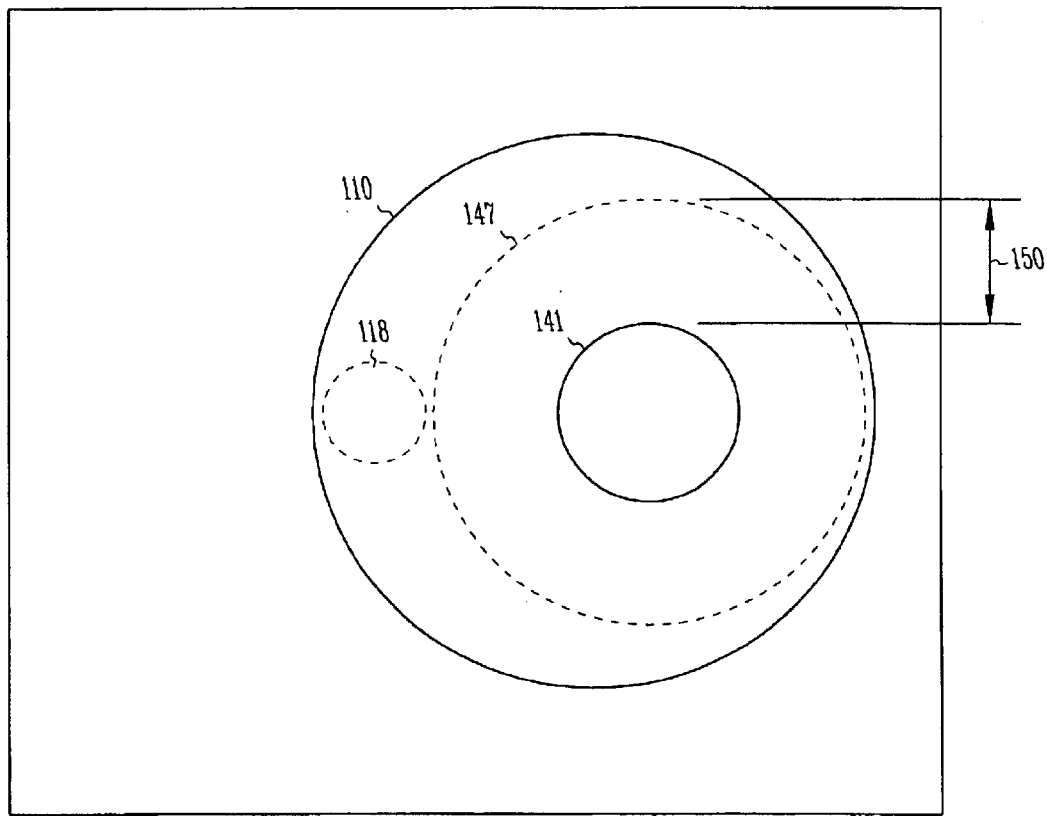
FIG. 10 shows a top view schematic of a pad 110 on a chip 100.

In some embodiments, contact aperture 122 is not centered under pad 110, but is instead placed at an outer edge of pad 110 (see FIG. 10).

Figure 5:
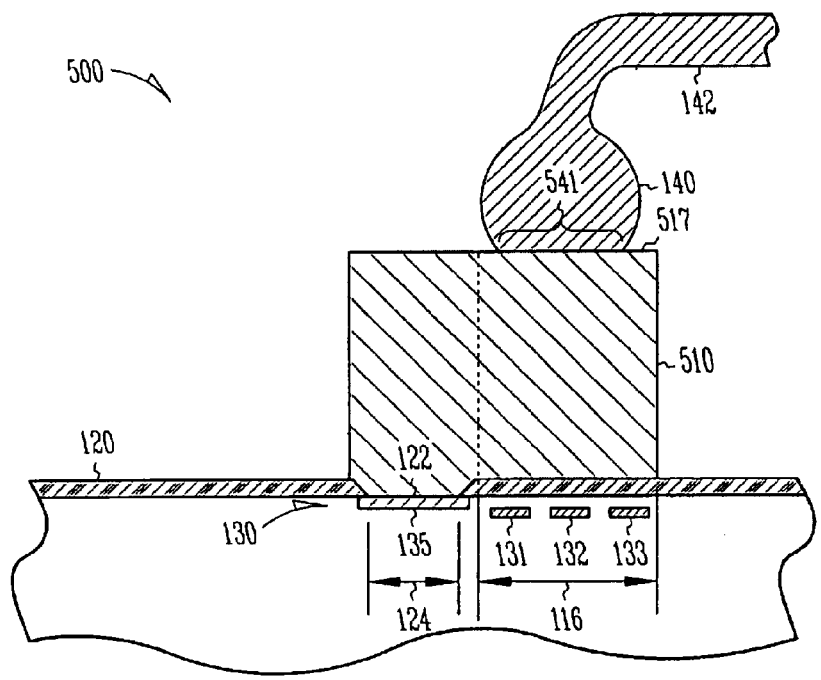
FIG. 5 is a cross-section schematic view of a portion of an electronics chip 500.

FIG. 5 is a cross-section schematic view of a portion of an electronics chip 500 of some embodiments. Recognizing that a much smaller target than bonding zone 117 of pad 110 (of FIG. 1, 2, and 4) can be used with a wirebonding machine of a given tolerance, chip 500 includes a smaller pad 510. In some embodiments, pad 510 is designed for use only with wirebonding, and thus can be made smaller or larger than pad 110 (which would be designed for the size needed for a solder ball connection). If pad 510 is smaller than pad 110, the pitch or center-to-center spacing of adjacent pads can be reduced in size, and very small wire (e.g., 25 microns or less in diameter) can be used. Conversely, to accommodate solder balls of a given size, the pad 110 must have a certain size, but pad 510 can be made larger than that, if it is used only for wirebonding (e.g., where large-diameter wire is used). In some embodiments, pad 510 has a square or rectangular top surface and vertical walls. In other embodiments, the pad is cylindrical in shape, wherein the diagram of pad 510 of FIG. 5 represents the cross-section of pad 110 of FIG. 10.

Figure 6:
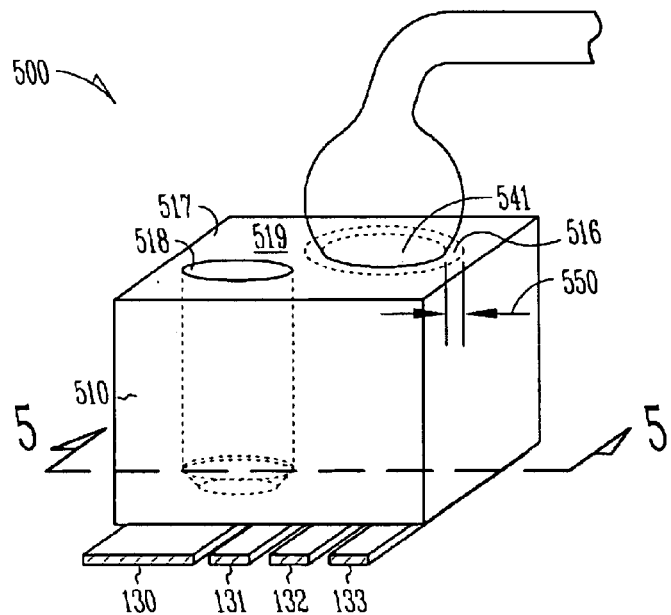
FIG. 6 is a partial cross-section perspective schematic view of electronics chip 500.
Figure 7:
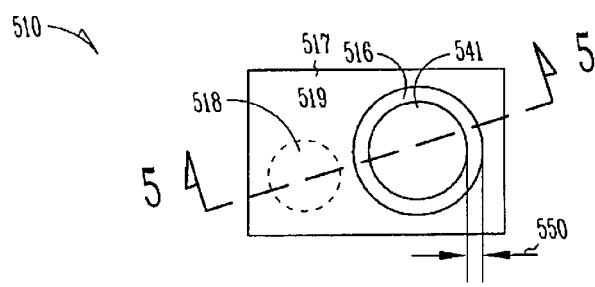
FIG. 7 is a top view schematic of a wirebond pad 510.

FIG. 6 is a partial cross-section perspective schematic view of electronics chip 500. In some embodiments, contact aperture 122 is placed in one corner of the rectangle, excluded zone 518 is above aperture 122, and bonding zone 517 includes the rest of top surface 519. In some embodiments, to surface 519 includes contact area 541. However, with a given bonding machine tolerance 550, a circular effective allowable bonding zone 516 results. The top surface of pad 510 can be rectangular as shown in FIGS. 6 and 7, circular, or any other suitable shape, and can be made as small as needed but still allowing room for excluded zone 518 and effective allowable bond zone 516. Otherwise, it is made in the same manner as pad 110 of FIG. 1.

FIG. 7 is a top view schematic of a wirebond pad 510. Top surface 519 includes excluded zone 518 and bonding zone 516, which can either or both be larger, as long as both fit within the boundary of top surface 519. FIG. 7 shows some room between the edge of excluded zone 518 and the edge of pad top surface 519, between the edge of excluded zone 518 and the edge of bonding zone 516, and between the edge of bonding zone 516 and the edge of pad top surface 519, as used in some embodiments. In other embodiments, no such space is provided, such as shown in FIG. 6.

Figure 8:
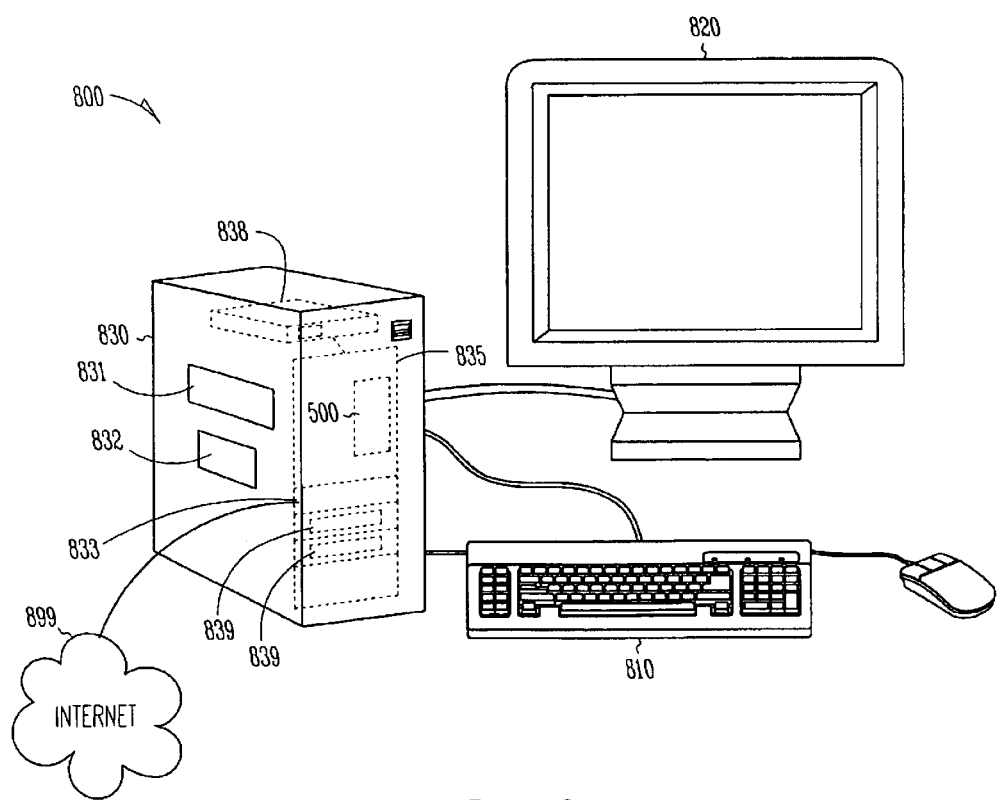
FIG. 8 is a perspective-view schematic of an information-handling system 800 having a packaged wirebonded chip 500 on a motherboard 835.

FIG. 8 is a perspective-view schematic of an information-handling system 800 that includes a wirebonded chip 100 or 500 on a motherboard 835. In some embodiments, system 800 includes input/output devices such as keyboard 810, display 820, one or more of CDROM/DVD player and/or recorder/CDRW drive 831, diskette drive 832 and internet connection 833 used to connect to the internet 899. System box 830 holds a number of parts including a power supply 838 and a motherboard 835. Motherboard 835 connects to one or more memories 839 (such as DIMM or RIMM packages, for example), and includes one or more chips 500 packaged such as 500 of FIG. 5. Power supply 838 provides power for at least some of system 800.

Figure 9:
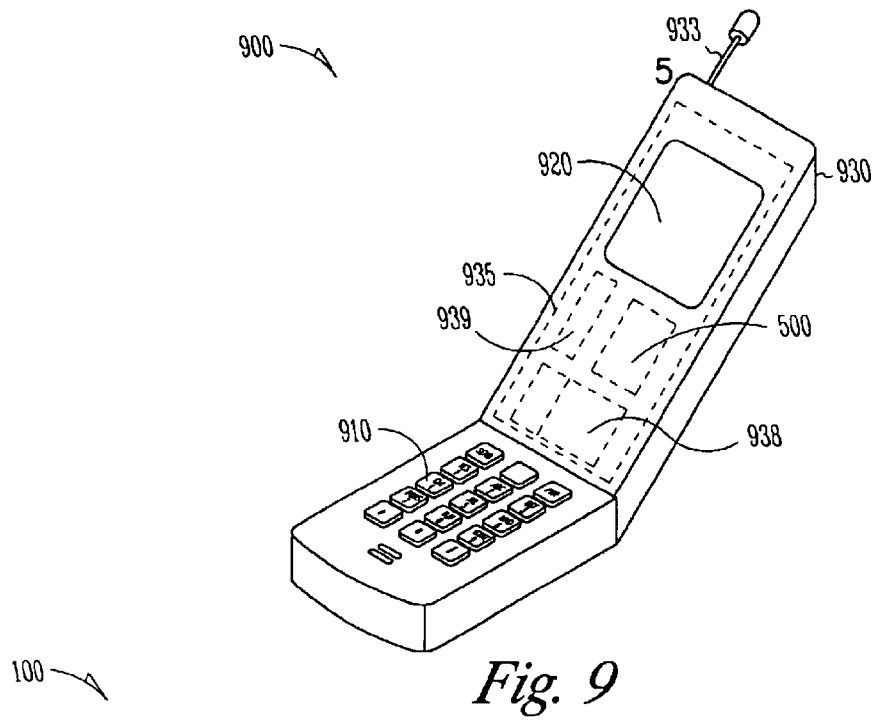
FIG. 9 is a perspective-view schematic of cell-phone embodiment information-handling system 900 having a packaged wirebonded chip 500.

FIG. 9 is a perspective-view schematic of an information-handling system 900 that includes a wirebonded chip 100 or 500 on a motherboard 895. In some embodiments, system 900 is a mobile cell phone that includes input/output devices such as keyboard 910, display 920, and antenna 933 used to connect to a wireless network such as a GSM ("Global System for Mobile Communications"), TDMA ("Time Division Multiple Access") or CDMA ("Code Division Multiple Access") network. System box 930 holds a number of parts including a power supply 938 and a motherboard 935. In some embodiments, motherboard 935 connects to one or more memories 939 (such as FLASH or EPROM packages, for example), and includes one or more chips 500 or 100 packaged such as 500 of FIG. 5. Power supply 938, such as batteries, provides power for at least some of system 900.

FIG. 10 shows a top view of a pin 110 on a chip 100 used in some embodiments, where contact aperture 122 is not centered under pad 110, but is instead placed at an outer edge of pad 110. This still allows pad 110 to be used for both solder-ball connections and wirebond connections, but provides a much larger tolerance for the wirebonding machine, or a much larger bonding ball contact area 141, or both. In some embodiments, effective allowable bonding zone 147 has twice the diameter as that shown in FIG. 4 when excluded zone 118 is moved to one edge of pad 110. Thus, some embodiments provide dual-purpose pads that are capable of flip-chip (e.g., using solder balls) assembly and wirebond assembly without resorting to new and expensive mask changes and, importantly, using the same silicon design/layout flow to service two distinctly different types of assembly and package outcomes. This provides a competitive edge where a wirebondable flip-chip pad technology can benefit lower performance small-die size/low I/O count silicon fabrication needs that use low-cost wirebond assembly and packaging methods in, for example, the Asia, Pacific-rim and Taiwan and yet also service the higher-performance, large-die-size, high I/O count devices that need flip-chip without changing the silicon layout rules and procedures, and without requiring expensive new mask sets. Another example is the use of stacked combined flip-chip plus wirebond combinations of the same or different types of devices using dual-purpose connection pads.

Some embodiments of the invention include an apparatus that includes an electronics chip 100 (or 500) having a substrate 105 with a first face 106 having circuitry 130 thereon, an electrically insulating layer 120 deposited on at least a portion of the first face 106, and a plurality of electrical connection pads 110 (or 510) including a first pad, the first pad having an electrical connection to the circuitry 130 through an aperture 122 in the insulating layer and a peripheral bonding zone region 117 (or 517) extending over the insulating layer 120.

In some embodiments, the insulating layer 120 is compliant (i.e., either entirely, or it contains a compliant portion).

In some embodiments, the bonding zone 117 (or 517) for wirebonding is exclusively over the insulating layer 120 outside of the aperture 122.

In some embodiments, the plurality of pads 110 is suitable for solder-ball connections and is suitable for wirebond connections.

In some embodiments, the aperture 122 is centered on the first pad 110 such as shown in FIGS. 1 and 3.

In some embodiments, the aperture 122 is offset to an edge of the first pad 510 such as shown in FIGS. 5 and 10.

In some embodiments, the first pad 110 or 510 is circular in shape as shown in FIG. 4, for example.

In some embodiments, the first pad 110 or 510 is rectangular in shape as shown in FIG. 7, for example.

In some embodiments, the circuitry 130 includes at least a portion of a processor, and the apparatus further includes a memory 839 operatively coupled to the processor, an input/output system, including a display unit 820, operatively coupled to the processor, and a power supply 838 operatively coupled to the processor, for example as shown in FIG. 8.

In some embodiments, the circuitry 130 includes at least a portion of a telecommunications circuit, and the apparatus further includes an antenna 933 operatively coupled to the telecommunications circuit, an input/output system, including a display unit 920, operatively coupled to the telecommunications circuit, and a power supply 938 operatively coupled to the telecommunications circuit, for example as shown in FIG. 9.

Another aspect of the invention, in some embodiments, includes a method that includes providing an electronics chip having a substrate with a first face having circuitry thereon, a electrically insulating layer deposited on at least a portion of the first face, and a plurality of electrical connection pads including a first pad, the first pad having an electrical connection to the circuitry through an aperture in the insulating layer and a peripheral bonding zone region extending over the insulating layer adjacent to the aperture, and attaching a wirebond structure to the peripheral bonding zone region over the insulating layer of the first pad.

In some embodiments, the insulating layer is compliant.

Some embodiments of the method further include removing native oxides from the bonding zone region before the attaching of the wirebond structure.

In some embodiments, the attaching of the wirebond structure includes attaching a gold ball on an end of a gold wire to the bonding zone region.

In some embodiments, the attaching of the wirebond structure includes attaching a copper ball on an end of a copper wire to the bonding zone region In some embodiments, the electrical connection pads are made of copper.

Yet another aspect of the invention, in some embodiments, includes a method that includes providing a first electronics chip having a semiconductor electronics circuit formed on a first face, covering at least a portion of the first face with a compliant insulating layer, forming a first copper pad on the insulating layer such that the pad has an electrical connection to the electronics circuit and has a peripheral area that extends over the insulating layer to a side of the electrical connection.

In some embodiments, the covering of the portion of the first face includes depositing a nitride layer and depositing a polyimide layer.

Some embodiments of this method further include attaching a wirebond structure to the peripheral area over the insulating layer of the first pad.

In some embodiments, the first pad is of a size and shape suitable for solder-ball bonding.

In some embodiments, the forming of the first pad includes forming the electrical connection at substantially the center of the pad.

In some embodiments, the forming of the first pad includes forming the electrical connection at substantially an edge of the pad.

Some embodiments of the invention include an apparatus that includes an electronics chip, and pad means as describe herein for wirebonding attached to the chip. In some embodiments, a first pad of the pad means is circular in shape. In some embodiments, a first pad of the pad means is rectangular in shape. In some embodiments (see for example, FIG. 8), the chip includes at least a portion of a processor, and the apparatus further includes a memory operatively coupled to the processor, an input/output system, including a display unit, operatively coupled to the processor, and a power supply operatively coupled to the processor.

In some embodiments(see for example, FIG. 9), the chip includes at least a portion of a telecommunications circuit, the apparatus further includes an antenna operatively coupled to the telecommunications circuit, an input/output system, including a display unit, operatively coupled to the telecommunications circuit, and a power supply operatively coupled to the telecommunications circuit.

It is understood that the above description is intended to be illustrative, and not restrictive. Many other embodiments will be apparent to those of skill in the art upon reviewing the above description. The scope of the invention should be, therefore, determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

What is claimed is:

1. A method comprising:

providing an electronics chip having a substrate with a first face having circuitry thereon, an electrically insulating layer deposited on at least a portion of the first face, and a plurality of electrical connection pads including a first pad, the first pad having an electrical connection to the circuitry through an aperture in the insulating layer and a peripheral bonding zone region extending over the insulating layer adjacent to the aperture; and attaching a wirebond structure to the peripheral bonding zone region over the insulating layer of the first pad.

2. The method of claim 1, wherein the providing the chip includes providing the chip wherein the electrically insulating layer is compliant.

3. The method of claim 1, further comprising:

removing native oxides from the bonding zone region before the attaching of the wirebond structure.

4. The method of claim 1, further comprising:

suppressing native oxides from the bonding zone region before the attaching of the wirebond structure.

5. The method of claim 1, wherein the attaching of the wirebond structure includes attaching a gold ball on an end of a gold wire to the bonding zone region.

6. The method of claim 1, wherein the attaching of the wirebond structure includes attaching a copper ball on an end of a copper wire to the bonding zone region.

7. The method of claim 6, wherein the providing of the chip includes providing the chip wherein the plurality of electrical connection pads is made of copper.

8. A method comprising:

providing a first electronics chip having a semiconductor electronics circuit formed on a first face;

covering at least a portion of the first face with an insulating layer; and forming a first copper pad on the insulating layer such that the pad has an electrical connection to the electronics circuit and has a peripheral area that extends over the insulating layer to a side of the electrical connection.

9. The method of claim 8, wherein the covering of the portion of the first face includes depositing a nitride layer and depositing a polyimide layer.

10. The method of claim 8, further comprising:

attaching a wirebond structure to the peripheral area over the insulating layer of the first pad.

11. The method of claim 8, wherein the first pad is of a size and shape suitable for solder-ball bonding.

12. The method of claim 8, wherein the forming of the first pad includes forming the electrical connection at substantially the center of the pad.

13. The method of claim 8, wherein the forming of the first pad includes forming the electrical connection at substantially an edge of the pad.

14. The method of claim 8, wherein the providing the first electronics chip includes providing the first chip as part of a wafer having a plurality of other chips that are similar or identical to the first chip.

15. The method of claim 8, further comprising:

packaging the first chip into a package;

mounting the package onto a circuit board having other circuitry; and enclosing the circuit board in a case.

* * * * *